United States Patent
Lee et al.

(10) Patent No.: US 6,541,824 B2
(45) Date of Patent: Apr. 1, 2003

(54) MODIFIED SOURCE SIDE INSERTED ANTI-TYPE DIFFUSION ESD PROTECTION DEVICE

(75) Inventors: Jian-Hsing Lee, Hsin-Chu (TW); Jiaw-Ren Shih, Hsin-Chu (TW); Shui-Hung Chen, Hsin-Chu (TW); Yi-Hsun Wu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/957,275

(22) Filed: Sep. 21, 2001

(65) Prior Publication Data

US 2002/0014665 A1 Feb. 7, 2002

Related U.S. Application Data

(62) Division of application No. 09/407,110, filed on Sep. 27, 1999, now Pat. No. 6,306,695.

(51) Int. Cl.[7] .............................. H01L 23/62
(52) U.S. Cl. .................. 257/355; 257/111; 257/360; 257/361; 257/367; 257/370; 257/368; 438/309; 438/152; 438/135; 438/203; 438/301
(58) Field of Search .................. 257/101, 111, 257/360, 355, 368, 336, 204, 357, 358, 356; 438/152, 135, 203, 301, 548, 309; 326/30; 361/212

(56) References Cited

U.S. PATENT DOCUMENTS

| | | | | |
|---|---|---|---|---|
| 5,246,872 A | * | 9/1993 | Mortensen | 438/200 |
| 5,262,344 A | | 11/1993 | Mistry | 437/57 |
| 5,291,051 A | * | 3/1994 | Hoang et al. | 257/360 |
| 5,440,163 A | | 8/1995 | Ohhashi | 257/355 |
| 5,532,178 A | * | 7/1996 | Liaw et al. | 438/200 |
| 5,565,790 A | | 10/1996 | Lee | 326/30 |
| 5,623,156 A | | 4/1997 | Watt | 257/355 |
| 5,672,896 A | * | 9/1997 | Lee et al. | 257/360 |
| 5,721,439 A | | 2/1998 | Lin | 257/204 |
| 5,744,840 A | | 4/1998 | Ng | 257/360 |
| 5,811,856 A | * | 9/1998 | Lee | 257/355 |
| 5,856,693 A | | 1/1999 | Onishi | 257/336 |
| 5,932,918 A | * | 8/1999 | Krakauer | 257/368 |
| 5,982,600 A | * | 11/1999 | Cheng | 361/111 |
| 6,147,538 A | * | 11/2000 | Andresen et al. | 327/309 |

* cited by examiner

Primary Examiner—Matthew Smith
Assistant Examiner—Belur V. Keshavan
(74) Attorney, Agent, or Firm—George O. Saile; Stephen B. Ackerman; Billy Knowles (57) ABSTRACT

An ESD protection circuit that will prevent internal circuits of an integrated circuit is formed on a semiconductor substrate to prevent damage during extreme voltage levels from an ESD voltage source and is connected to an input/output pad. A plurality of drains of multiple MOS FET's is formed within the surface of the semiconductor substrate and are each connected to the input/output pad. A plurality of sources of the multiple MOS FET's is formed within the surface of the semiconductor substrate and are placed at a distance from the plurality of drains and are connected to a ground reference potential. Pairs of the plurality of sources are adjacent to each other. A plurality of isolation regions placed between each source of the pairs of sources and are allowed to float. The multiple MOS FET's have a plurality of parasitic bipolar junction transistors. When contacting an ESD voltage source to the collectors of the plurality of parasitic bipolar junction transistors, the junction formed between the collector and the base of the parasitic bipolar junction transistor enters into avalanche breakdown. The avalanche breakdown generates a large current through the substrate bulk resistances that is sufficiently large as to cause the base emitter junctions of all the parasitic bipolar junction transistors and turn on the parasitic bipolar junction transistors. The conduction of all the parasitic bipolar junction transistors is sufficient to cause the ESD voltage to be discharged thus preventing damage to the internal circuitry.

19 Claims, 5 Drawing Sheets

MODIFIED SOURCE SIDE INSERTED ANTI-TYPE DIFFUSION ESD PROTECTION DEVICE

RELATED PATENT APPLICATIONS

This is a division of Patent Application Ser. No. 09/407,110, filing date Sep. 27, 1999, A Modified Source Side Inserted Anti-Type Diffusion Esd Protection Device, assigned to the same assignee as the present invention and not U.S. Pat. No. 6,306,695.

U.S. Pat. No. 5,811,856, (Lee), Ser. No.: 554,994, Filing Date: Nov. 13, 1995, Assigned to the Same Assignee as the present invention, and included herein by reference.

BACKGROUND OF THE INVENTION

1. Field of the Invention

This invention is related to Metal Oxide Semiconductor (MOS) Field Effect Transistor (FET) structure formed on a semiconductor substrate to protect internal integrated circuits present on the semiconductor substrate from damage due to extreme voltages from electrostatic discharge (ESD).

2. Description of the Related Art

Electrostatic discharge (ESD) damage has become one of the main reliability concerns on the integrated circuit (IC) products. Especially, now that complementary metal oxide semiconductor (CMOS) technology has developed into the deep-submicron lithographic feature size, the scaled-down metal oxide semiconductor (MOS) devices and thinner gate oxide has become more vulnerable to the extreme voltage level from contact with an ESD voltage source. For general industrial specifications, the input and output pins of the IC products have to sustain the extreme voltage level from contact with an ESD voltage source of above 2,000V. Therefore, the ESD protection circuits have to be placed around the input and output pads of the IC's to protect the IC's against the ESD damage by shunting the electrical charges present at the ESD voltage source from the internal circuits of the IC's.

Figure 1A:
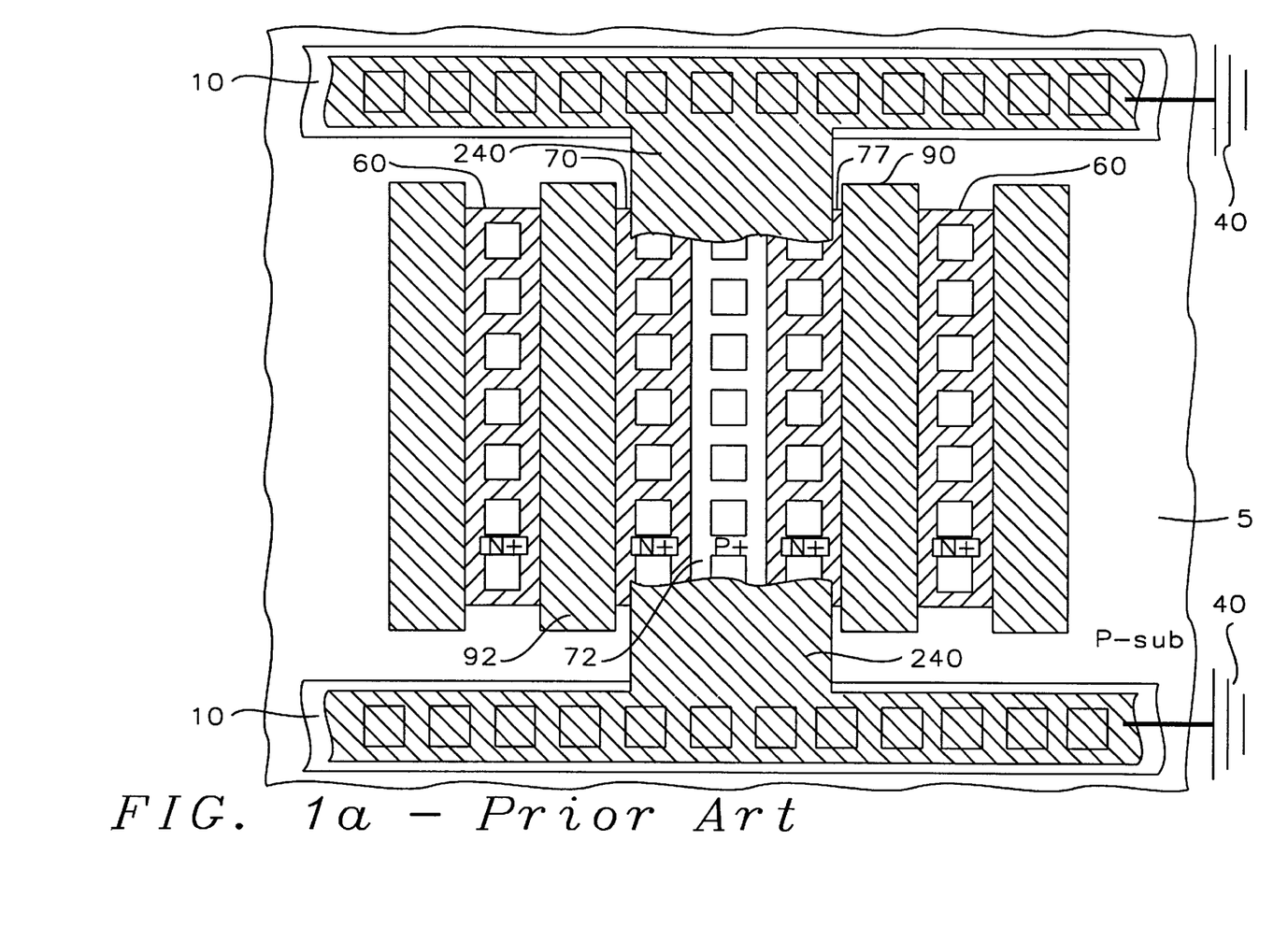
FIG. 1a illustrates a modified top view of an ESD protection circuit of Lee.
Figure 1B:
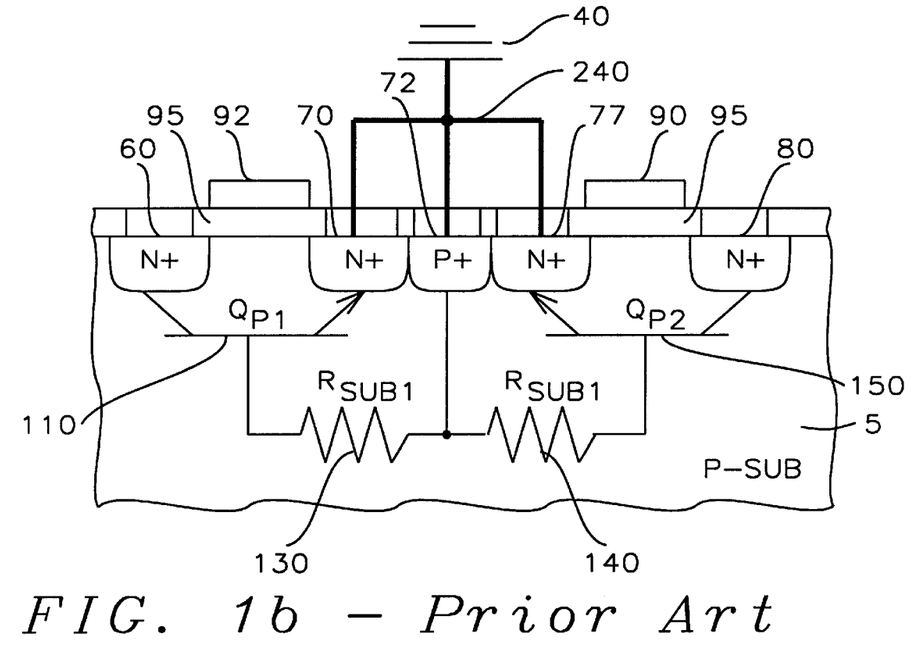
FIG. 1b illustrates a modified cross-sectional view of the ESD protection circuit of Lee showing the equivalent circuit connections.

FIGS. 1a and 1b illustrate a modified version of the ESD structure as described in Lee. The second N+ diffusion 60 forms the collector of the parasitic bipolar junction transistor 110 and the third N+ diffusion 70 forms the emitter of the parasitic bipolar junction transistor 110. The base of parasitic bipolar junction transistor is the area of the P-type substrate 5.

The fourth N+ diffusion 80 forms the collector of the parasitic bipolar junction transistor 150 and the N+ diffusion 77 forms the emitter of the parasitic bipolar junction transistor 150. The base of the parasitic bipolar junction transistor 150 is the area of the P-type substrate 5 between the fourth N+ diffusion 80 and the N+ diffusion 77.

Further, the fourth N+ diffusion 80 and the N+ diffusion 77 respectively form the drain and source of the first MOS FET to dissipate the electrical charge of the ESD voltage source. Additionally, the second N+ diffusion 60 and the N+ diffusion 77 respectively form the drain and source of a second MOS device to dissipate the charge of the ESD voltage source. The conductive layer 90 that is formed on the insulative gate oxide 95 forms the gate of the first MOS FET. The conductive layer 92 is optionally formed on the insulative gate oxide 95 to form the gate of the second MOS device. If the conductive layer 92 is eliminated the field device structure of Lee is formed.

The second P+ diffusion 72 of Lee forms an isolation region to separate the third N+ diffusion 70 and the N+ diffusion 77. The third N+ diffusion 70, the N+ diffusion 77, and the second P+ diffusion 72 are connected with the conductive layer 240 through the guard ring 10 to the ground reference potential 40.

As described in Lee, when the ESD voltage source is brought in contact with the input terminal or input pad of the integrated circuit the currents that result due to the avalanche breakdown of the junctions of the second N+ diffusion 60 with the P-type substrate 5 and the fourth N+ diffusion 80 with the P-type substrate 5 cause equal currents to flow in the bulk resistors 130 and 140 thus causing the parasitic bipolar junction transistors 110 and 150 to conduct more evenly to dissipate the charge from the ESD voltage source.

U.S. Pat. No. 5,623,156 (Watt) teaches an ESD protection circuit and structure for input/output devices. The circuit provides protection against ESD on input/output pads by providing a more uniform current distribution through a pulldown FET. The ESD structure of Watt employees a source-side series resistor for the pulldown FET. The structure includes three major portions: the pulldown FET formed in a semiconductor substrate (preferably p-type), an ohmic contact region (preferably P+), and a resistor.

U.S. Pat. No. 5,262,344 (Mistry) discloses an N-channel clamp for ESD protection in self-aligned silicided CMOS process. The ESD protection device is formed in an integrated circuit by an N-channel grounded-gate transistor. This protection device has a polysilicon gate, with the siliciding of the protection device is controlled so that adverse effects of ESD events are minimized. There are no silicide areas created on top of the polysilicon gate of the protection device, nor on the source/drain regions near the gate and self-aligned with the gate, as there is for other transistors made by the CMOS process. The siliciding of the protection transistor near the gate is prevented by using a deposited oxide layer as a mask, and this oxide layer is also used to create sidewall spacers for the transistor gates.

U.S. Pat. No. 5,856,693 (Onishi) describes a semiconductor integrated circuit device that improve the ESD breakdown resistance of its protection MOSFET. The protection MOSFFT with the LDD structure. The LDD region of the drain is larger than the LDD region of the source. Thus, the resistance of the drain region is greater than that of the source region, increasing the breakdown voltage of the protection MOSFET. As a result, even if the snapback voltage of the MOSFET fluctuates or varies from place to place in the same MOSFET, the snapback phenomenon tends to occur within the entire drain region almost simultaneously and improving the ESD protection of the internal circuits.

U.S. Pat. No. 5,565,790 (Lee) discloses and ESD protection circuit with field transistor clamp and resistor in the gate circuit of a clamp triggering FET. The ESD protection circuit has a field transistor connected as a clamp between ground and a pad to be protected and an FET trigger circuit that is connected between ground and an input/output node where the protected circuits are connected. A resistor interconnects the pad and the node. The trigger FET turns on when a high ESD voltage causes avalanche breakdown and charge carriers from the trigger FET turn on the field transistor clamp. Before the field transistor clamp turns on, oxide breakdown in the gate oxide of the FET occurs. A resistor is connected between the gate electrode and ground to limit the current through the oxide during the time for the avalanche to develop and for the clamp to turn on.

U.S. Pat. No. 5,440,163 (Ohhashi) teaches a CMOS inverter that has an resistance between the source regions of the n-channel MOS transistor and the branches the ground wiring layer and an resistance between the drain regions of the n-channel MOS transistor and the branches of the output wiring layer. The p-channel MOS transistor of the CMOS inverter does not have the resistances in the source and drain connections. If electrostatic pulses are applied through the power supply and ground terminals of the device, the CMOS inverter is prevented from being destroyed.

U.S. Pat. No. 5,721,439 (Lin) teaches a MOS transistor structure for an ESD protection circuit of an integrated circuit device. The ESD protection transistor has a structure that comprises a drain diffusion region formed in the silicon substrate of the integrated circuit device, a source diffusion region formed in the silicon substrate, a gate formed in the silicon substrate, and a number of isolated islands evenly distributed throughout the drain diffusion region. The isolated islands provide substantially uniform diffusion resistance between the drain contacts and the gate while increasing the diffusion resistance of the drain region to a level suitable for ESD current protection.

U.S. Pat. No. 5,744,840 (Ng) describes an ESD device structure for protecting one or more nodes of an integrated circuit. The protecting device structure includes an MOS diode structure having source and drain regions and at least a pair of localized auxiliary region. Each of this pair of localized auxiliary regions has a conductivity type that is opposite from that of the source and drain regions. These localized auxiliary regions are located contiguous with the source and drain regions, respectively, and in the channel between the source and drain regions.

SUMMARY OF THE INVENTION

An object of this invention is to provide an ESD protection circuit that will prevent internal circuits of an integrated circuit formed on a semiconductor substrate from incurring damage during extreme voltage levels when in contact with an ESD voltage source.

To accomplish this and other objectives, an ESD protection circuit is connected to an input/output pad, which is formed on a semiconductor substrate. The semiconductor substrate is lightly doped with a material of a first conductivity type and connected to the ground reference potential. A plurality of drains of multiple MOS FET's is formed within the surface of the semiconductor substrate from heavily doped diffusions of a material of a second conductivity type. The plurality of drains are each connected to the input/output pad. Further, a plurality of sources of the multiple MOS FET's is formed within the surface of the semiconductor substrate from heavily doped diffusions of the material of the second conductivity type. The heavily doped diffusions of the plurality of sources are placed at a distance from the plurality of drains within said area of the semiconductor substrate, and are connected to a ground reference potential. Pairs of the plurality of sources are adjacent to each other. A plurality of isolation regions from a heavily doped diffusion of the material of the first conductivity type placed between each source of the pairs of sources. The plurality of isolation regions are allowed to electrically float.

The multiple MOS FET's have a plurality of parasitic bipolar junction transistors. Each parasitic bipolar junction transistor has an emitter that is one of the sources of one of the multiple MOS FET's, a collector that is one of the drains of the one MOS FET, and a base that is a region between the source and drain of the one MOS FET.

A plurality of first bulk resistors is formed whereby each first bulk resistor is formed of a bulk resistance of the semiconductor substrate in a region in close proximity to the base of the one of the parasitic bipolar junction transistors and effectively having a first terminal connected to said base. A plurality of second bulk resistors is formed whereby each bulk resistor is formed of the bulk resistance of the semiconductor substrate not composing said first bulk resistors and having a first terminal connected to the effective junction of a second terminal of a pair of the plurality of first bulk resistors and a second terminal connected to the ground reference potential. The first terminals of the pair of first bulk resistors are connected to the bases of two parasitic bipolar junction transistors whose emitters are formed of adjacent sources of the multiple MOS FET's.

An ESD voltage source such as an electrostatically charged object is made to instantaneously contact to the input/output pad. The voltage of the ESD voltage source is of a magnitude of at least 2,500 volts. When the contacting of the ESD voltage to the input/output pad transfers the voltage of the ESD voltage to the collectors of the plurality of parasitic bipolar junction transistors, the junction formed between the collector of the parasitic bipolar junction transistor and the base of the parasitic bipolar junction transistor enters into avalanche breakdown. The avalanche breakdown generates a large magnitude of holes to pass through the first bulk resistors into the second bulk resistors. The voltage developed across the first bulk resistors and the second bulk resistors is sufficiently large as to cause the base emitter junctions of all the parasitic bipolar junction transistors to start to conduct thus starting all the parasitic bipolar junction transistors to begin to conduct. The conduction of all the parasitic bipolar junction transistors is sufficient to cause the ESD voltage to be discharged thus preventing damage to the internal circuitry.

The input protection circuit has a snapback voltage that is less than 4.7V.

DETAILED DESCRIPTION OF THE INVENTION

Figure 2A:
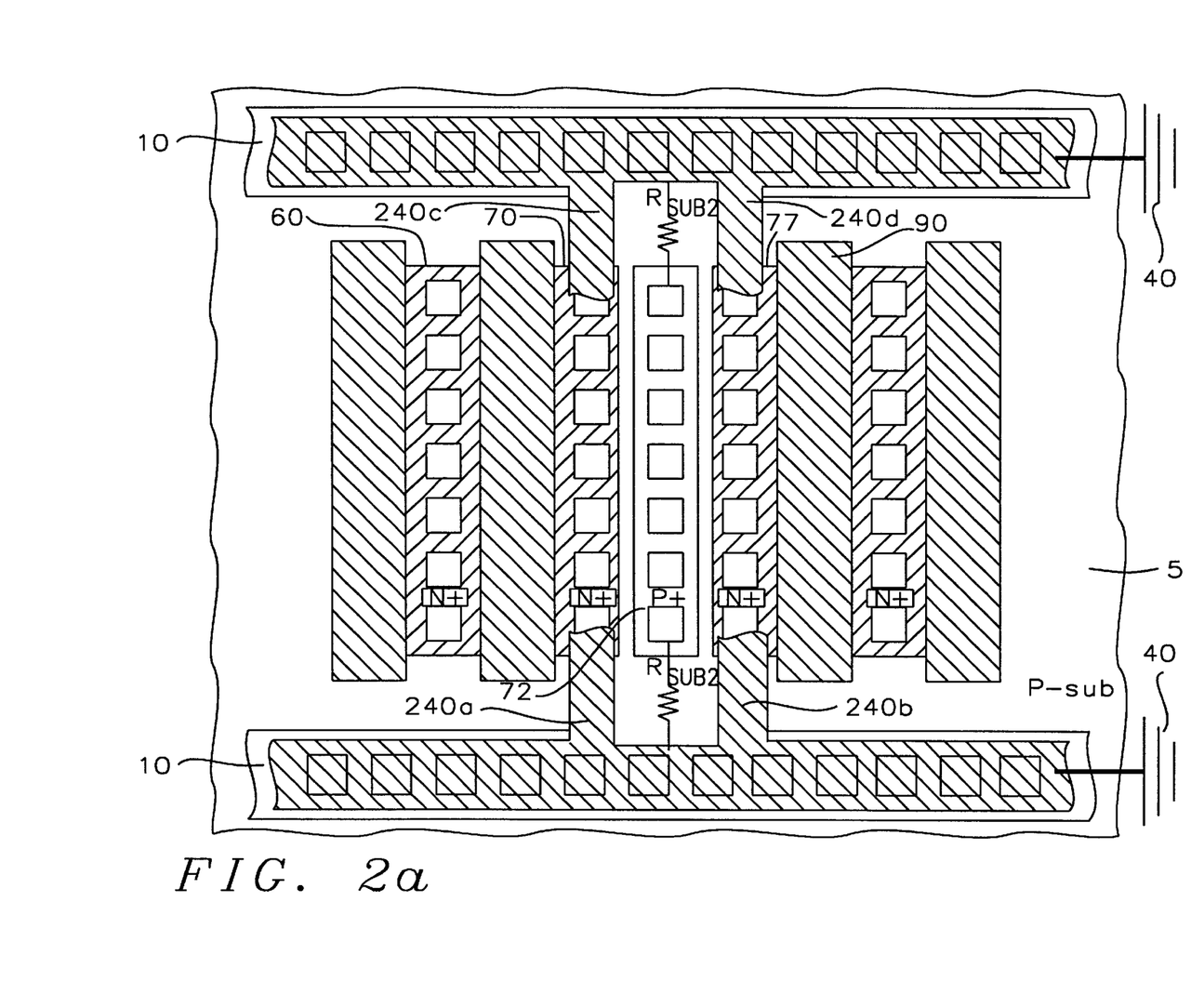
FIG. 2a illustrates a top view of an ESD protection circuit of this invention.
Figure 2B:
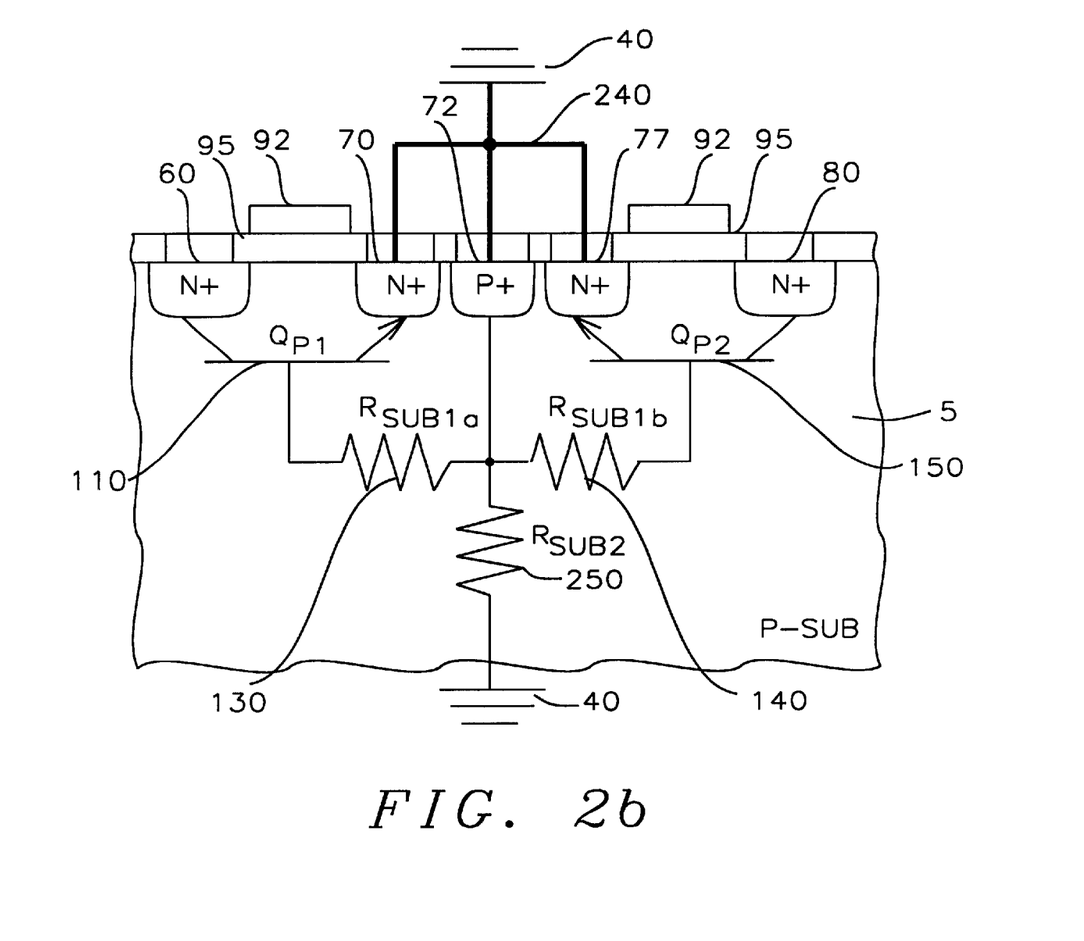
FIG. 2b illustrates a cross-sectional view of the ESD protection circuit showing the equivalent circuit connections of this invention.

Refer now to FIGS. 2a and 2b. As described in Lee, the second N+ diffusion 60 is formed by diffusing a heavily doped N-type material into the surface of the semiconductor substrate 5 to form a drain region of a first MOS FET. The drain region 60 performs the function as a collector for the parasitic bipolar junction transistor 110. The third N+ diffusion 70 is formed, similarly, by diffusing the heavily doped N-type material into the surface of the semiconductor substrate 5 to a source region 70 of the MOS FET. The source of the first MOS FET performs the function of the emitter of the parasitic bipolar junction transistor 110. The optional gate 92 is formed on the insulating gate oxide 95 of a conductive material such as polysilicon. The gate 92 is eliminated for the field device structure as described in Lee.

The base of the parasitic bipolar junction transistor 110 is the channel region between the drain region 60 and the source region 70 and beneath the gate 92.

The fourth N+ diffusion 80 is formed as described above by diffusing the heavily doped N-type material into the surface of the semiconductor substrate 5 to form the drain region of a second MOS FET. The drain region 80 performs the function of the collector of the parasitic bipolar junction transistor 150. In similar fashion, a fifth N+ diffusion 77 is formed by diffusing the heavily doped N+ material into the surface of the semiconductor substrate 5 to form the source region of the second MOS FET. The source region 77 performs the function of the emitter of the parasitic bipolar junction transistor 150.

The gate 92 of the second MOS FET is formed on the insulative gate oxide 95. The base of the parasitic bipolar junction transistor 150 is the region of the semiconductor substrate 5 located between the drain region 80 and the source region 77 and beneath the gate 95.

The isolating P+ diffusion 72 is created by diffusing a heavily doped P+ material into the surface of the semiconductor substrate 5. The isolating P+ diffusion is placed between and contiguous to the source region 70 and the source region 77.

The drain region 60 and the drain region 80 are connected as shown in Lee to the input/output terminal. The input/output terminal provides the connection from external circuits to the internal circuits of the integrated circuit. Further, the ESD voltage will be brought instantaneously in contact with the input/output terminal as shown in Lee.

The source region 70 and the source region 77 are connected through the conductive layers 240a, 240b, 240c, and 240d through the guard ring 10 to the ground reference potential 40. Additionally, the substrate 5 is connected through the guard ring 10 to the ground reference potential 40.

The isolating P+ diffusion 72 of this invention is not connected to any other device or feature and remains floating. This increases the distance that the discharge current must travel to reach the ground reference potential and creates the bulk resistive structure of this invention.

The first bulk resistive structure includes the bulk resistor Rsub1a 130 is that is the bulk resistance of the semiconductor substrate 5 in proximity to the first MOS FET and the bulk resistor Rsub1b 140 that is the bulk resistance of the semiconductor substrate 5 in proximity of the second MOS FET. The second bulk resistor Rsub2 250 is the bulk resistance of the semiconductor substrate 5, the conductive layers 240a, 240b, 240c, and 240d, and the guard ring 10. This bulk resistance includes all structures within the path to the ground reference potential 40.

The first terminal of the bulk resistor Rsub1a 130 is effectively connected to the base of the parasitic bipolar junction transistor 110. The first terminal of the bulk resistor Rsub1b 140 is effectively connected to the base of the parasitic bipolar junction transistor 150.

The second terminals of the bulk resistors Rsub1a 130 and Rsub1b 140 are joined together and connected to a first terminal of the second bulk resistor Rsub2 250. The second terminal of the second bulk resistor Rsub2 is connected to the ground reference potential 40.

When voltage source with a magnitude of greater than 2,500 volts makes contact with the input/output terminal, the ESD voltage is transferred to the drain region 60 of the first MOS FET and to the drain 80 of the second MOS FET. As the voltage exceeds the MOS FET drain breakdown voltage that is limited by the gate oxide 95 thickness, a large number of electron-hole pairs are generated, as in the prior art. The difference from the prior art is that in the present invention the base resistance 130 of field device 110 is connected to a longer, but common, path to the ground reference potential 40. This path makes the base resistors Rsub1a 130 and Rsub1b 140 for the parasitic bipolar junction transistors 110 and 150 approximately equal and the voltage developed at the bases of the parasitic bipolar junction transistors 110 and 150 higher, thus causing the parasitic bipolar junction transistors 110 and 150 to have lower snapback voltages. The lower snapback voltage allows a higher immunity to ESD voltage levels.

Figure 3:
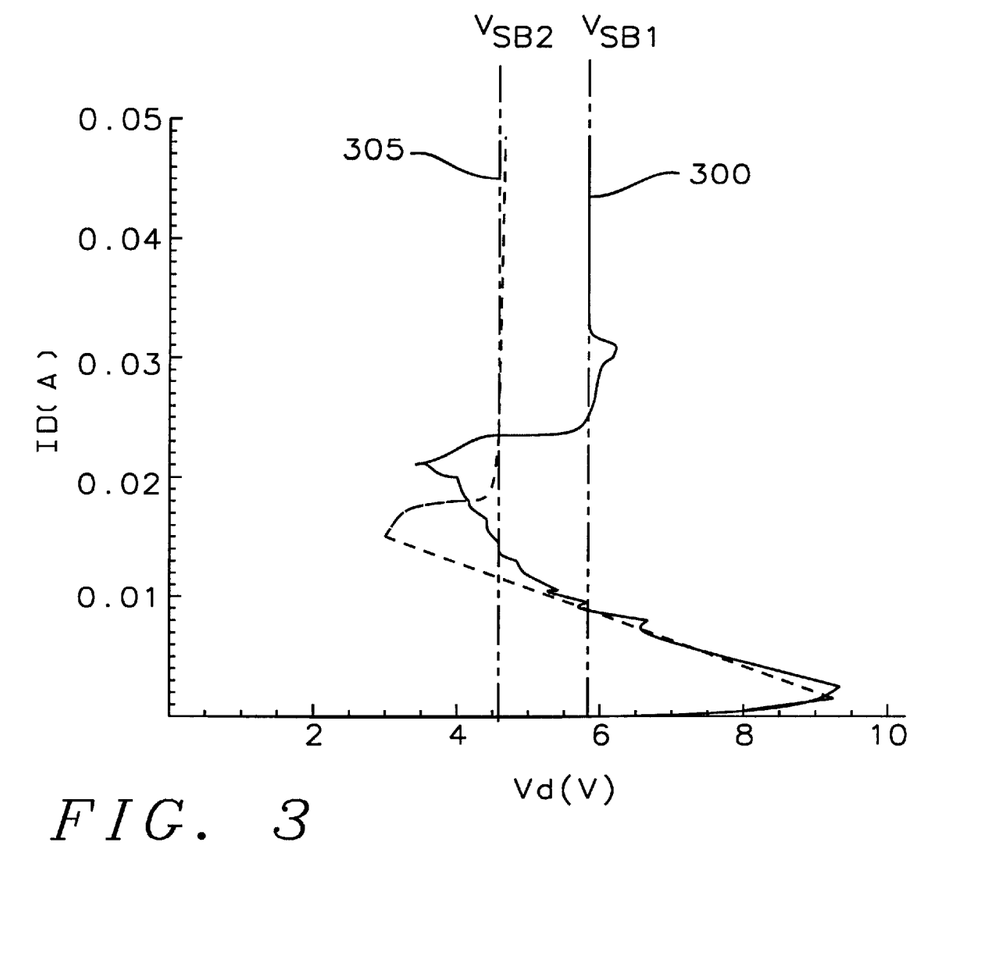
FIG. 3 is a plot of the drain current in amps versus the drain to source voltage of the ESD protection circuit of the prior art as compared with the ESD protection circuit of this invention.

Refer now to FIG. 3 to review the comparison of the snapback voltage $V_{SB2}$ 305 of the ESD protection circuit of this invention as compared to the snapback voltage $V_{SB1}$ 300 of the ESD protection circuit of the prior art.

The ESD protection circuits of this invention and the prior art have a voltage source Vd placed between the input/output terminal and the ground reference potential. This is effectively the drain-to-source voltage of the MOS FET's of the ESD protection circuit. The voltage source is increased from zero volts and the collective drain current Id of the MOS FETs is measured. It is apparent that the snapback voltage $V_{SB1}$ 300 of the ESD protection circuit of the prior art is approximately 5.7V, while the snapback voltage $V_{SB2}$ 305 of the ESD protection circuit of this invention is approximately 4.7V. This allows the ESD voltage source to have a voltage of greater than 2.5KV for MOS FET's of the present invention having a channel width of 100 $\mu$m and a channel length of 0.4 $\mu$m before failure. The ESD voltage source has a voltage level greater than 5.0KV for MOS FET's of this invention having a channel width of 200 $\mu$m and a channel length of 0.4 $\mu$m before failure. The respective voltage levels before failure of the MOS FET's of the prior art are 2.0KV and 4KV.

Other Embodiments

The device described in FIGS. 2a and 2b can be implemented in an equivalent structure having an N substrate and a P-type diffusion. This structure of FIGS. 2a and 2b can also equivalently be implemented as a PNP parasitic bipolar junction transistor in an N substrate or an N-well on a P substrate by the adjusting of the conductivity and polarity of the semiconductor materials. This device structure can also be implemented in integrated circuit designs implementing PNP parasitic bipolar junction transistor designs. Those skilled in the art will recognize the variations in the descriptions as within the art and intended scope of the claims.

While this invention has been particularly shown and described with reference to the preferred embodiments thereof, it will be understood by those skilled in the art that various changes in form and details may be made without departing from the spirit and scope of the invention.

The invention claimed is:

1. An ESD protection circuit connected to a connection pad and to internal circuitry on a highly dense integrated circuit formed on a semiconductor substrate to improve protection from extreme voltage levels applied by an ESD voltage source to said integrated circuit chip through said connection pad, comprising:

a plurality of MOS FET's, whereby each MOS FET has a source connected to a ground reference potential and a drain connected to the connection pad, whereby the sources of a pair of the MOS FET's are isolated by an isolating diffusion means having a conductivity opposite said sources, and said isolating diffusion means is electrically floating;

a plurality of parasitic bipolar junction transistors, whereby each bipolar junction transistor comprises an emitter, a base, and a collector, wherein the source of the MOS FET's is the emitter, the drain of the one MOS FET is the collector and the channel region between the source and the drain is the base;

a plurality of first bulk resistors, whereby each first bulk resistor is formed of the bulk resistance of the semiconductor substrate in proximity to the base of each MOS FET, wherein each of the first bulk resistors has a first terminal connected to the base of one of the parasitic bipolar junction transistors and a second terminal; and a plurality of second bulk resistors, whereby each second bulk resistor is formed of the bulk resistance of the semiconductor substrate not in proximity with the base of each MOS FET, and whereby each second bulk resistor has a first terminal connected to a junction of two of the second terminals of the first bulk resistors and a second terminal connected to the ground reference potential.

2. The ESD protection circuit of claim 1 wherein the sources of the plurality of MOS FET's are highly concentrated diffusions of a material of a first conductivity type within a surface of said semiconductor substrate and two of said sources are separated by a highly concentrated diffusion of a second conductivity type within the surface of said semiconductor substrate.

3. The input protection circuit of claim 1 wherein an ESD voltage source such as an electrostatically charged object is made to instantaneously contact to the connection pad.

4. The input protection circuit of claim 3 wherein the voltage of the ESD voltage source is of the magnitude of at least 2,500 volts.

5. The input protection circuit of claim 3 wherein the contacting of the ESD voltage to the connection pad transfers the voltage of the ESD voltage to the collectors of the plurality of parasitic bipolar junction transistors.

6. The input protection circuit of claim 5 wherein a junction is formed between the collector of the parasitic bipolar junction transistor and the base of the parasitic bipolar junction transistor enters into avalanche breakdown when the voltage at the drain of the MOS FET is sufficiently large.

7. The input protection circuit of claim 6 wherein the avalanche breakdown generates a large magnitude of holes to pass through the first bulk resistors into the second bulk resistors.

8. The input protection circuit of claim 7 wherein a voltage developed across the first bulk resistors and said second bulk resistors is sufficiently large as to cause the base emitter junctions of all the parasitic bipolar junction transistors to start to conduct thus starting all the parasitic bipolar junction transistors to begin to conduct.

9. The input protection circuit of claim 8 wherein the conduction of all the parasitic bipolar junction transistors is sufficient to cause the ESD voltage to be discharged thus preventing damage to the other circuitry.

10. The input protection circuit of claim 1 wherein a snapback voltage is less than 4.7V.

11. An ESD protection circuit connected to an input/output pad, formed on a semiconductor substrate, and comprising:

an area of said semiconductor substrate being lightly doped with a material of a first conductivity type and connected to the ground reference potential;

a plurality of drains of multiple MOS FET's formed from heavily doped diffusions of a material of a second conductivity type placed within said area of the semiconductor substrate and connected to the input/output pad;

a plurality of sources of the multiple MOS FET's formed from heavily doped diffusions of the material of the second conductivity type placed at a distance from the plurality of drains within said area of the semiconductor substrate, and connected to a ground reference potential, whereby pairs of said plurality of sources are adjacent to each other;

a plurality of isolation regions from a heavily doped diffusion of the material of the first conductivity type placed between adjacent sources, and electrically floating;

a plurality of parasitic bipolar junction transistors whereby each parasitic bipolar junction transistor has an emitter that is one of the sources of one of the multiple MOS FET's, a collector that is one of the drains of the one MOS FET, and a base that is a region between the source and drain of the one MOS FET;

a plurality of first bulk resistors whereby each first bulk resistor is formed of a bulk resistance of the semiconductor substrate in a region in close proximity to the base of the one of the parasitic bipolar junction transistors and effectively having a first terminal connected to said base;

a plurality of second bulk resistors whereby each bulk resistor is formed of the bulk resistance of the semiconductor substrate not composing said first bulk resistors and having a first terminal connected to the effective junction of a second terminal of a pair of the plurality of first bulk resistors and a second terminal connected to the ground reference potential, whereby the first terminals of the pair of first bulk resistors are connected to the bases of two parasitic bipolar junction transistors whose emitters are formed of adjacent sources of the multiple MOS FET's.

12. The input protection circuit of claim 11 wherein an ESD voltage source such as an electrostatically charged object is made to instantaneously contact to the input/output pad.

13. The input protection circuit of claim 12 wherein the voltage of the ESD voltage source is of the magnitude of at least 2,500 volts.

14. The input protection circuit of claim 12 wherein the contacting of the ESD voltage to the input/output pad transfers the voltage of the ESD voltage to the collectors of the plurality of parasitic bipolar junction transistors.

15. The input protection circuit of claim 14 wherein a junction is formed between the collector of the parasitic bipolar junction transistor and the base of the parasitic bipolar junction transistor enters into avalanche breakdown when the voltage at the drain of the MOS FET is sufficiently large.

16. The input protection circuit of claim 15 wherein the avalanche breakdown generates a large magnitude of holes to pass through the first bulk resistors into the second bulk resistors.

17. The input protection circuit of claim 16 wherein a voltage developed across the first bulk resistors is sufficiently large as to cause the base emitter junctions of all the parasitic bipolar junction transistors to start to conduct thus starting all the parasitic bipolar junction transistors to begin to conduct.

18. The input protection circuit of claim 17 wherein the conduction of all the parasitic bipolar junction transistors is sufficient to cause the ESD voltage to be discharged thus preventing damage to the other circuitry.

19. The input protection circuit of claim 11 wherein a snapback voltage is less than 4.7V.

* * * * *